United States Patent [19]

Kawada

[11] Patent Number: 4,962,476

[45] Date of Patent: Oct. 9, 1990

[54] SEMICONDUCTOR MEMORY DEVICE HAVING BIT LINES LESS LIABLE TO HAVE INFLUENCES OF THE ADJACENT BIT LINES

[75] Inventor: Koji Kawada, Tokyo, Japan

[73] Assignee: NEC Corporation, Tokyo, Japan

[21] Appl. No.: 383,397

[22] Filed: Jul. 21, 1989

[30] Foreign Application Priority Data

Jul. 26, 1988 [JP]   Japan ................................ 63-186011

[51] Int. Cl.⁵ ............................................ G11C 13/00
[52] U.S. Cl. ........................................ 365/53; 365/51; 365/149
[58] Field of Search ................... 365/51, 53, 149, 150, 365/174, 182

[56] References Cited

U.S. PATENT DOCUMENTS 4,914,628   4/1990   Nishimura ............................ 365/149

Primary Examiner—Terrell W. Fears
Attorney, Agent, or Firm—Sughrue, Mion, Zinn, Macpeak & Seas

[57] ABSTRACT

A semiconductor memory device according to the present invention has a plurality of memory cells of the one-transistor and one-capacitor type, and a plurality of bit lines coupled to columns of the memory cells, respectively, and disposed in an insulating film over the memory cells, and a common upper electrode is shared by the storage capacitors of the memory cells and has shield portions interposed between the bit lines, so that the adjacent bit lines are less liable to be capacitively coupled by virtue of the shield portions, thereby allowing data bit signals to propagate without any undesirable influence of the adjacent bit lines.

8 Claims, 9 Drawing Sheets

SEMICONDUCTOR MEMORY DEVICE HAVING BIT LINES LESS LIABLE TO HAVE INFLUENCES OF THE ADJACENT BIT LINES

FIELD OF THE INVENTION

This invention relates to a semiconductor memory device and, more particularly, to a layout of a memory cell of the one-transistor and one-capacitor type incorporated in the dynamic random access memory device.

DESCRIPTION OF THE RELATED ART

A typical example of the one-transistor and one-capacitor type memory cell is shown in FIGS. 1 to 3, and fabricated on a p-type semiconductor substrate 1.

In the surface portion of the p-type semiconductor substrate 1 is defined an active area by a thick field insulating film 2, and n-type impurity regions 3, 4, 5 and 6 are formed in the active area. However, these n-type impurity regions 3 to 6 do not shown in FIG. 1 for the sake of avoiding any confusion. The n-type impurity regions 3, 4 and 6 provides source (or drain) regions of field effect transistors, and the n-type impurity region 5 serves as a common drain (or common source) region of the adjacent two field effect transistors. On channel forming areas between the regions 3 and 6 and the common region 5 are grown thin gate insulating films which are respectively overlain by word lines 7 and 8 serving as gate electrodes of the adjacent two field effect transistors. Thus, the region 3, the common region 5 and the word line 7 as a whole constitute one of the two field effect transistor 9, and the common region 5 is shared between the field effect transistor 9 and the other field effect transistor 10 formed with the region 6 and the word line 8.

The word lines 7 and 8 are covered with an insulating film 11 where contact windows 12 and 13 are formed and expose the source regions 3 and 6, respectively. Accumulation electrodes 14 and 15 are formed on the insulating film 11 and pass through the contact windows 12 and 13, respectively, thereby coming into contact with the regions 3 and 6, respectively. The accumulation electrodes 14 and 15 are oxidized to form thin dielectric films 16 and 17, and the dielectric films 16 and 17 are covered with a conductive film 18 serving as common electrode. The accumulation electrode 14, the thin dielectric film 16 and the common electrode 18 form in combination a storage capacitor 20 which in turn forms a memory cell together with the field effect transistor 9. In the similar manner, the accumulation electrode 15, the thin dielectric film 17 and the common electrode 18 as a whole constitute another storage capacitor 21, and the storage capacitor 21 and the field effect transistor 10 form in combination another memory cell.

The conductive film 18 is further covered with an inter-level insulating film 22, and bit lines 23 and 24 are patterned on the inter-level insulating film 22. The bit line 23 comes into contact with the common region 5 through a contact window 25 formed in the inter-level insulating film 22. The bit lines 23 and 24 are covered with an upper level insulating film 26 for providing a protection against vapor and contamination.

The bit line 23 propagates a data bit in the form of electric charges, and the electric charges are transferred from the bit line 23 through the common region 5, either region 3 or 6 to either accumulation electrode 14 or 15 depending upon the activated word line 7 or 8 in a write-in mode of operation. Assuming now the data bit is stored in the storage capacitor 20, the word line 7 goes up to the active high voltage level for providing a channel between the region 3 and the common region 5 in a readout mode of operation. Then, the electric charges appears on the bit line 23, and the bit line 23 propagates the data bit in the form of electric charges to, for example, a sense amplifier circuit (not shown).

However, a problem is encountered in the prior art semiconductor memory device in that the bit line 23 is much liable to have influences of the adjacent bit lines if the gap therebetween is decreased. This is because of the fact that the bit lines are capacitively coupled to one another. In this circumstances, undesirable noises tends to ride on the data bit due to the capacitive coupling, and, accordingly, the sense amplifier circuit is liable to fail to correctly decide the logic level of the data bit.

SUMMARY OF THE INVENTION

It is therefore an important object of the present invention to provide a semiconductor memory device the arrangement of which is desirable for miniature memory cells.

It is also an important object of the present invention to provide a semiconductor memory device bit lines of which are less liable to have influences of the adjacent bit lines.

To accomplish these objects, the present invention proposes to provide a shield projection in the upper level insulating film between the adjacent bit lines.

In accordance with the present invention, there is provided a semiconductor memory device formed on a semiconductor substrate and comprising a plurality of memory cells and a plurality of word lines, each of the memory cells comprising (a) a field effect transistor having source and drain regions formed in a surface portion of the semiconductor substrate and spaced apart from one another, and a gate electrode formed by one of the word lines and located over that area between the source and drain regions, and (b) a storage capacitor having a lower electrode coupled to one of the source and drain regions, a thin dielectric film formed on the lower electrode, and an upper electrode formed on the dielectric film and coupled to a constant voltage source, in which the semiconductor memory device further comprises an inter-level insulating film covering the field effect transistor and the storage capacitor, a plurality of bit lines formed on the inter-level insulating film in a spacing relationship from one another, an upper level insulating film covering the bit lines, and shield plates each formed in the upper level insulating film and provided between two of the bit lines, one of the bit lines passing through a contact window formed in the inter-level insulating film for contacting the other of the source and drain regions, and in which the shield plates is coupled to the upper electrode.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First embodiment

Figure 1:
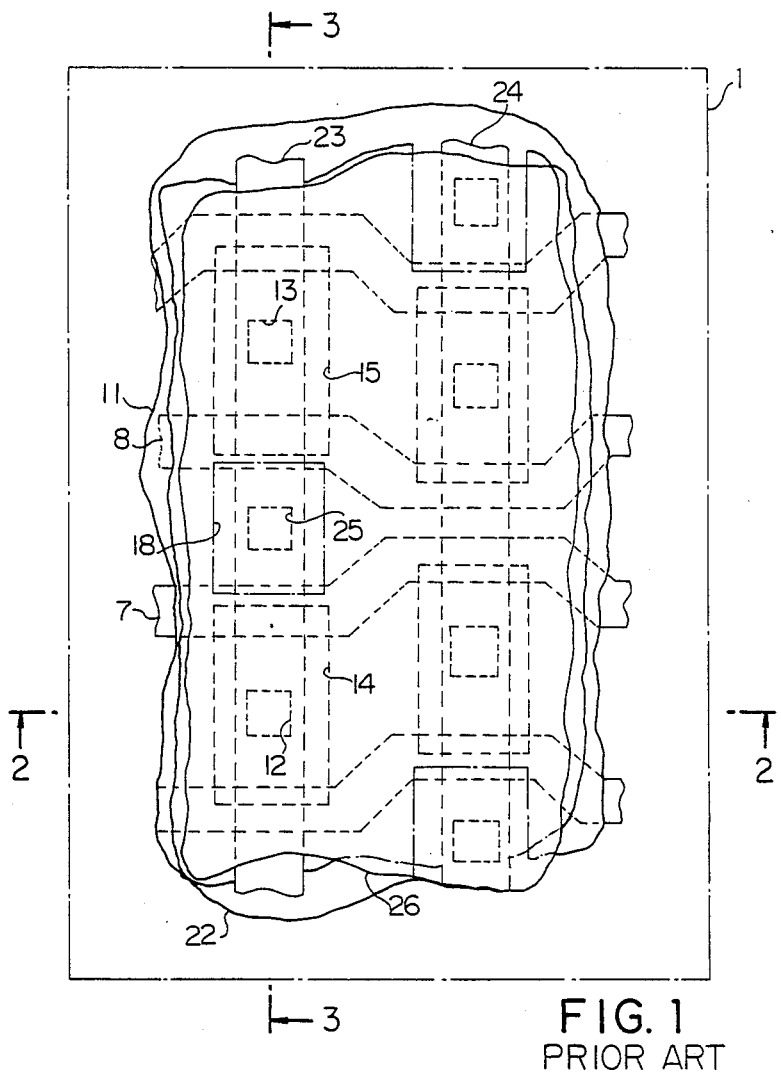
FIG. 1 is a plan view showing the layout of prior art random access memory cells of the one-transistor and one-capacitor type.
Figure 2:
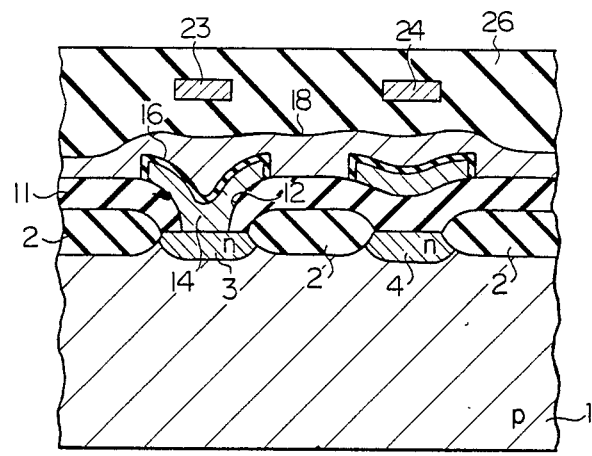
FIG. 2 is a cross sectional view taken along lines A—A and showing the structure of the prior art random access memory cells.
Figure 3:
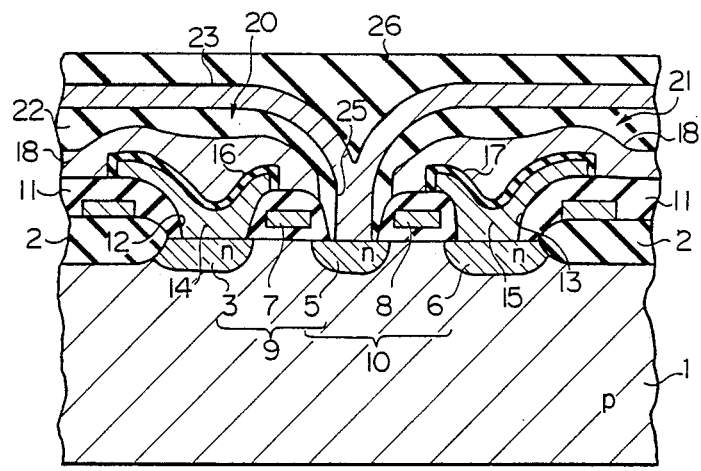
FIG. 3 is a cross sectional view taken along lines B—B and showing the structure of the prior art random access memory cells.
Figure 4:
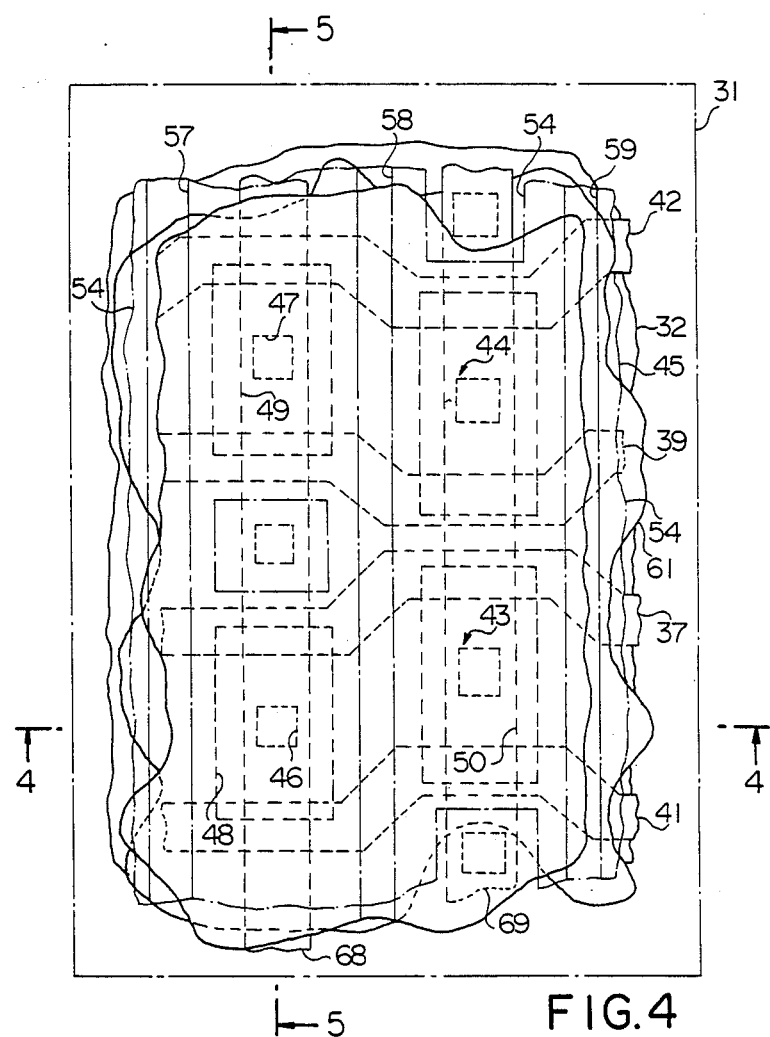
FIG. 4 is a plan view showing the layout of a random access memory device the present invention.

Referring first to FIG. 4 of the drawings, a random access memory device is fabricated on a p-type semiconductor substrate 31. In the surface portion of the semiconductor substrate 31 is selectively grown a thick field insulating film 32 which defines an active area, and n-type impurity regions 33, 34, 35 and 36 are formed in the active area in a spacing relationship. The n-type impurity regions 33, 34 and 36 provide source (or drain) regions respectively, and the n-type impurity region 35 serves as a common drain region (or common source region) 35. Over that area between the source region 33 and the common drain region 35 is formed a word line 37 which forms parts of a field effect transistor 38 together with the region 33 and the common region 35. Similarly, a word line 39 passes over that area between the region 36 and the common region 35, and the word line 39, the region 36 and the common region 35 form in combination a field effect transistor 40. Word lines 41 and 42 are formed on the field insulating film 32 and serve as gate electrodes of field effect transistors 43 and 44, respectively.

The word lines 37, 39, 41 and 42 as well as exposed active area are covered with a lower insulating film 45, and contact windows 46 and 47 are formed in the lower insulating film 45 and expose the regions 33 and 36, respectively. On the lower insulating film 45 are provided accumulation electrodes 48, 49 and 50 or lower electrodes two of which have respective projections passing through the contact windows 46 and 47, thereby coming into contact with the regions 33 and 36, respectively. The accumulation electrodes 48, 49 and 50 of doped polycrystalline silicon are oxidized to form dielectric films 51, 52 and 53, respectively, and the dielectric films 51 to 53 of silicon oxide are covered with a conductive film such as, for example, a doped polysilicon serving as a common electrode 54. The accumulation electrode 48, the dielectric film 51 and the common electrode 54 as a whole constitute a storage capacitor 55, and the storage capacitor 55 and the field effect transistor 38 form in combination a dynamic random access memory cell Similarly, the accumulation electrode 49, the dielectric film 52 and the common electrode 54 provide another storage capacitor 56 which in turn provides another dynamic random access memory cell together with the field effect transistor 40. The common electrode 54 is coupled to a constant voltage source VTL such as, for example, a ground node.

The conductive film 54 has a plurality of projections 57, 58 and 59, and the projections 57 to 59 serves as shield plate members. These projection is, by way of example, formed by using a CDV polysilicon deposition technique followed by lithographic techniques. In detail, when the conductive film 54 is deposited on the entire surface of the structure, hole 60 (see FIG. 6) is formed in the conductive film 54, and an inter-level insulating film 61 is deposited on the entire surface of the structure (see FIG. 7A). The inter-level insulating film 61 is selectively removed to form holes 62, 63 and 64 exposing portions of the conductive film 54, respectively as shown in FIG. 7B. A doped polysilicon 65 is deposited on the exposed portions of the conductive film 54, and the doped polysilicon 65 covers the entire surface of the inter-level insulating film 61 as shown in FIG. 7C. Though not shown in the drawings, a series of lithographic process steps are applied before the deposition of the doped polysilicon, and a contact window 66 (see in FIG. 6) is formed to expose the common region 35.

Figure 7A:
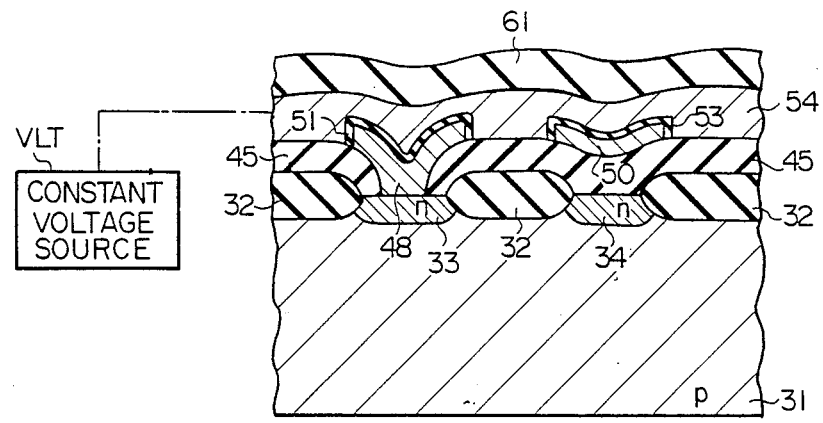
FIGS. 7A to 7F are cross sectional views showing a process sequence applied to the formation of the shield plate members shown in FIGS. 4 to 6.
Figure 7B:
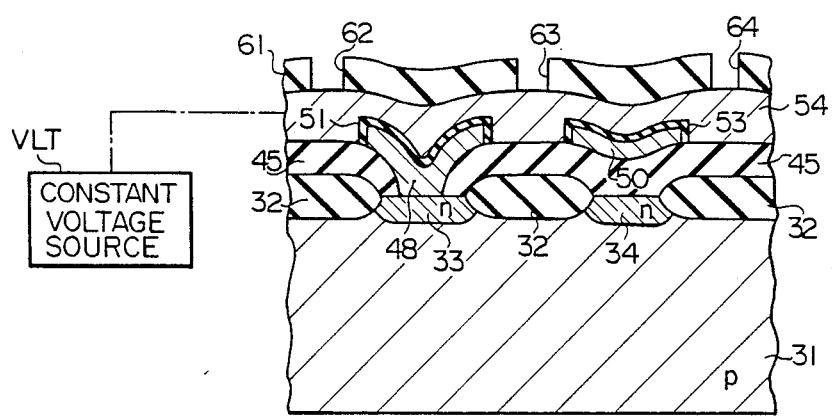
Figure 7C:
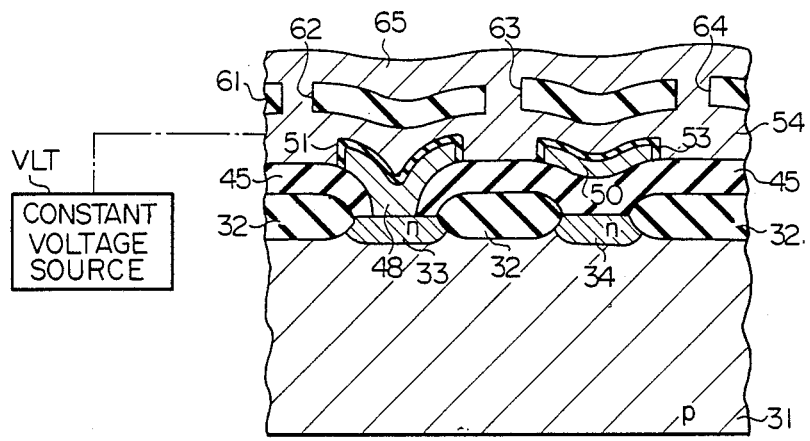
Figure 7D:
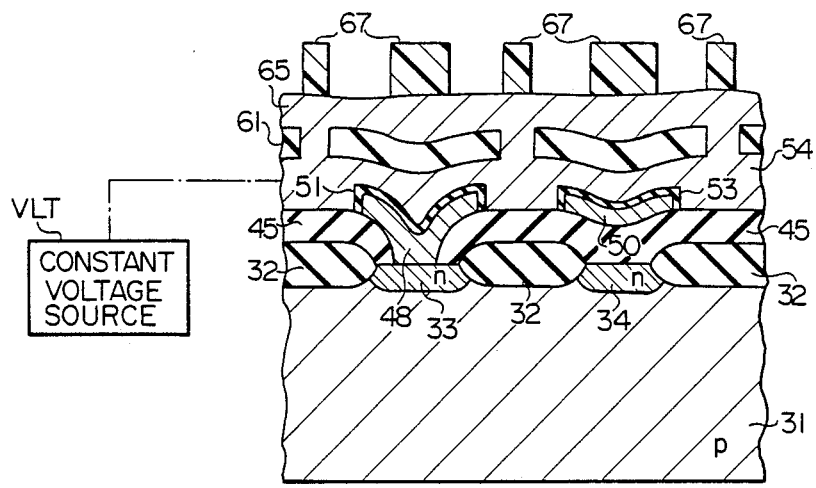
Figure 7E:
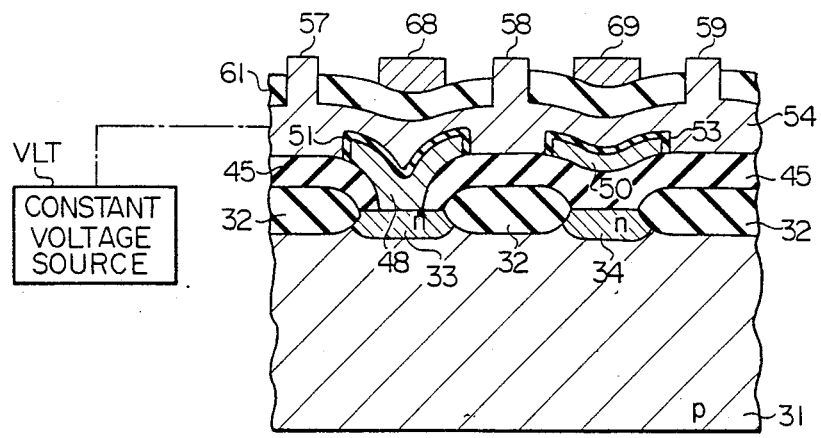
Figure 7F:
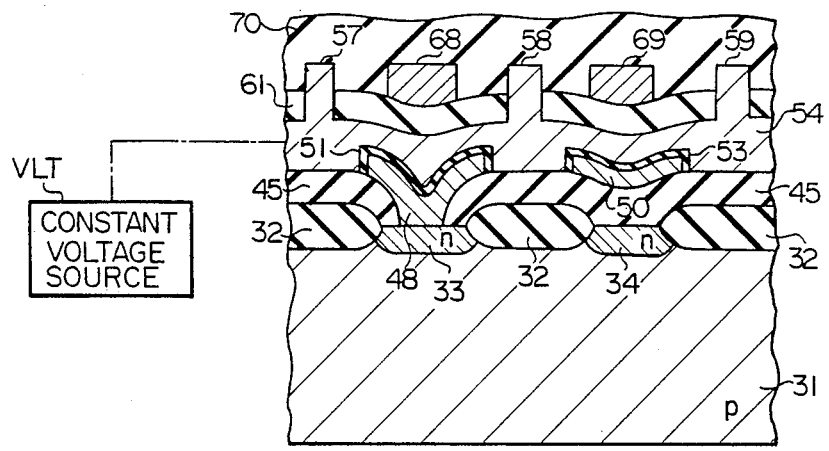

A photoresist solution is dropped on the doped polysilicon film 65 and is spun coated to form a photoresist film. The photoresist film is partially etched away and patterned to form a mask layer 67, and the resultant structure of this stage is illustrated in FIG. 7D. Using the mask layer 67, the doped polysilicon film 65 is selectively removed to form the projections 57, 58 and 59 as well as bit lines 68 and 69 as shown in FIG. 7E, and an upper level insulating film 70 of, for example, silicon dioxide is deposited over the entire surface of the structure. The resultant structure is shown in FIG. 7F.

Figure 5:
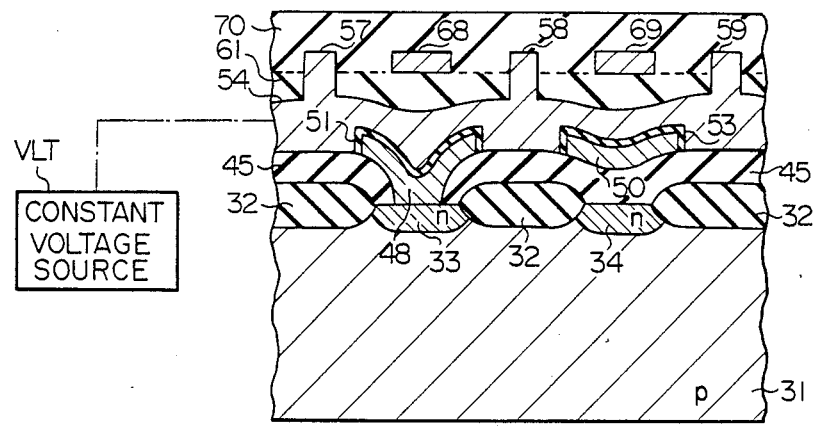
FIG. 5 is a cross sectional view taken along lines C—C of FIG. 4 and showing the structure of the random access memory device.
Figure 6:
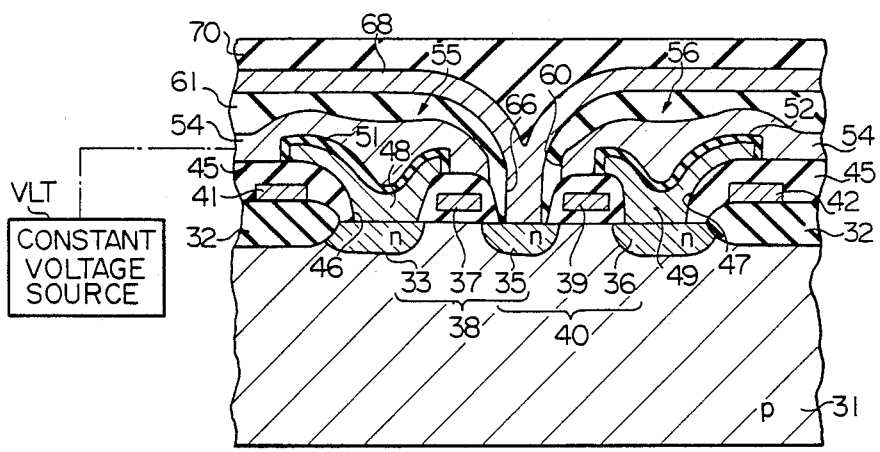
FIG. 6 is a cross sectional view taken along lines D—D of FIG. 4 and showing the structure of the random access memory device in a different angle.

A write-in mode of operation and a read-out mode of operation are selectively established in the random access memory device shown in FIGS. 4 to 6. If the write-in mode of operation is established and the word line 37 is activated by the external address signal, a data bit is supplied from the outside thereof through the bit line 68, the common region 35 and the region 33 to the accumulation electrode 48. As a result, the data bit is stored in the storage capacitor 55 in the form of electric charges.

When the random access memory device is shifted to the readout mode of operation, the word line 37 goes up to the active high voltage level, and, accordingly, the data bit in the form of the electric charges is read out from the storage capacitor 55 to the bit line 68. The bit line 68 propagates the data bit to, for example, a sense amplifier circuit (not shown), and the sense amplifier circuit rapidly decides the logic level of the data bit. On the way to the sense amplifier circuit, the data bit is less liable to be affected by the adjacent bit line 69, because any capacitive coupling hardly takes place between the bit lines 68 and 69 by virtue of the shield plate member 58. This results in that the random access memory device is free from any misreading of the data bit.

Second embodiment

Figure 8:
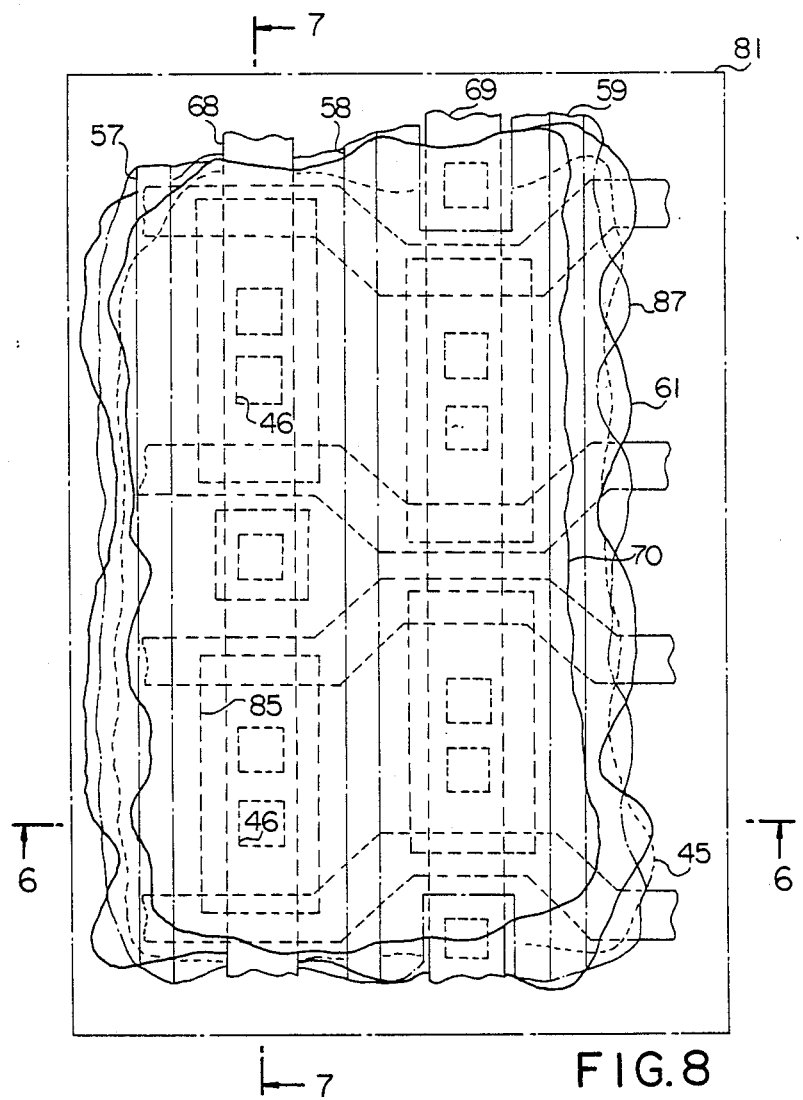
FIG. 8 is a cross sectional view showing the layout of another random access memory device embodying the present invention.
Figure 9:
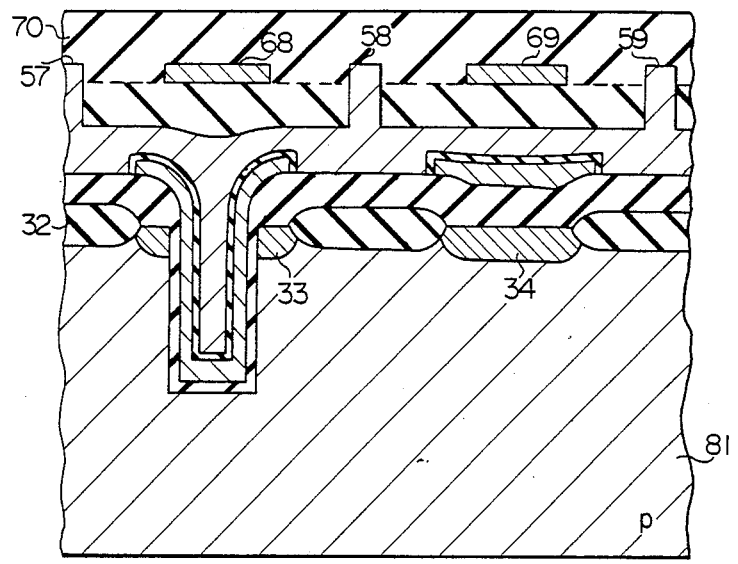
FIG. 9 is a cross sectional view taken along lines E—E of FIG. 8 and showing the structure of the random access memory device.
Figure 10:
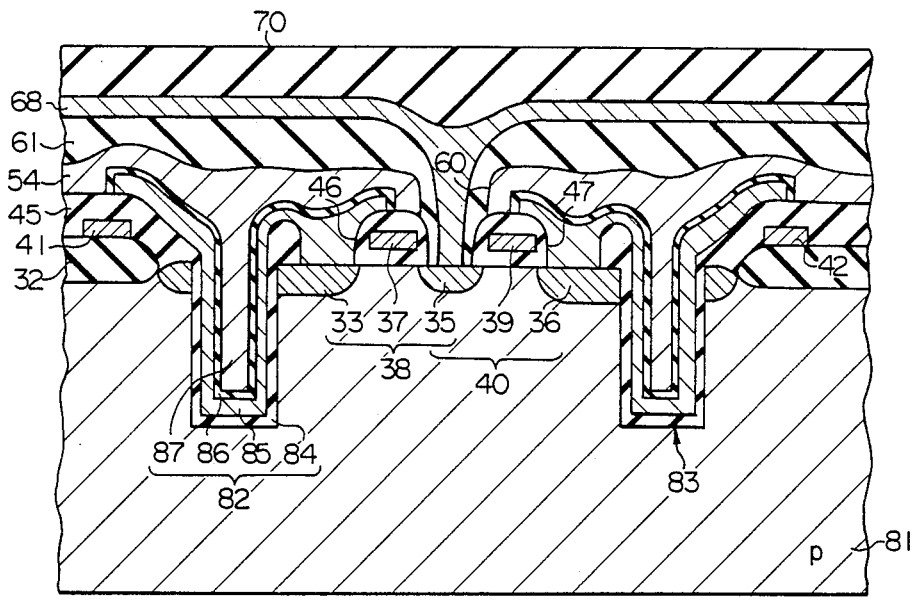
FIG. 10 is a cross sectional view taken along lines F—F of FIG. 8 and showing the structure of the random access memory device in a different angle.

Turning to FIGS. 8, 9 and 10, another random access memory device is shown and fabricated on a p-type semiconductor substrate 81. The random access memory device shown in FIGS. 8 to 10 is similar in structure to that shown in FIGS. 4 to 6 with the exception of storage capacitors 82 and 83, and, for this reason, description is made for the structure of each storage capacitors 82 and 83 only. The other component regions and films are designated by like reference numerals used for designations of the component regions and films in FIGS. 4 to 6, and no detail description is incorporated for the sake of simplicity.

The storage capacitors 82 and 83 are of the trench capacitor, and the storage capacitors 82 and 83 are similar to each other. Then, description is focused on the storage capacitor 82.

The semiconductor substrate 81 is vertically removed to form a trench, and the wall is covered with a thin insulating film 84. The trench is filled with a conductive material serving as an accumulation electrode 85, and a narrow vertical cavity is formed in the accumulation electrode 85. The wall defining the narrow vertical cavity is thermally oxidized to form a dielectric film 86, and a conductive material such as a doped polysilicon is deposited on the dielectric film 86. The conductive material is patterned to form a common electrode 87, and the projections 57 to 59 or the shield plate members are projected from the common electrode 87.

Operation of the random access memory device and the advantages thereof are similar to the first embodiment, so that description is omitted for the sake of simplicity.

Although particular embodiments of the present invention have been shown and described, it will be obvious to those skilled in the art that various changes and modifications may be made without departing from the spirit and scope of the present invention.

What is claimed is:

1. A semiconductor memory device formed on a semiconductor substrate and comprising a plurality of memory cells and a plurality of word lines, each of said memory cells comprising
   (a) a field effect transistor having source and drain regions formed in a surface portion of said semiconductor substrate and spaced apart from one another, and a gate electrode formed by one of said word lines and located over that area between the source and drain regions, and
   (b) a storage capacitor having a lower electrode coupled to one of said source and drain regions, a thin dielectric film formed on the lower electrode, and an upper electrode formed on the dielectric film and coupled to a constant voltage source, in which said semiconductor memory device further comprises an inter-level insulating film covering said field effect transistor and said storage capacitor, a plurality of bit lines formed on said inter-level insulating film in a spacing relationship from one another, an upper level insulating film covering said bit lines, and shield plates each formed in said upper level insulating film and provided between two of said bit lines, one of said bit lines passing through a contact window formed in said inter-level insulating film for contacting the other of said source and drain regions, and in which said shield plates is coupled to said upper electrode.

2. A semiconductor memory device as set forth in claim 1, in which said shield plates extend in substantially parallel to said bit lines, respectively.

3. A semiconductor memory device as set forth in claim 2, in which said field effect transistor is covered with a lower level insulating film, and in which said lower electrode is formed on said lower level insulating film and projects into a contact window formed in the lower level insulating film so as to come into contact with the surface of said one of said source and drain regions of said field effect transistor.

4. A semiconductor memory device as set forth in claim 3, in which said upper electrode is formed on said dielectric film and on said lower level insulating film.

5. A semiconductor memory device as set forth in claim 4, in which said upper electrode is covered with said inter-level insulating film, and in which said a contact hole is formed in said inter-level insulating film and in said lower level insulating film, wherein aforesaid one of said bit lines pass said contact hole so as to come into contact with said the other of said source and drain regions.

6. A semiconductor memory device as set forth in claim 2, in which said storage capacitor is of the trench capacitor.

7. A semiconductor memory device as set forth in claim 6, in which said field effect transistor is covered with a lower level insulating film.

8. A semiconductor memory device as set forth in claim 7, in which said storage capacitor comprises a thin insulating film covering a wall portion defining a trench formed in said semiconductor substrate, said lower electrode formed on said thin insulating film and defining a first vertical cavity in said trench, said dielectric film covering the lower electrode and defining a secondary vertical cavity in the first vertical cavity, and said upper electrode filling said secondary vertical cavity, and in which said lower electrode is partially disposed on said lower insulating film.

* * * * *

UNITED STATES PATENT AND TRADEMARK OFFICE
CERTIFICATE OF CORRECTION

PATENT NO. : 4,962,476
DATED : October 9, 1990
INVENTOR(S) : Koji Kawada

It is certified that error appears in the above-identified patent and that said Letters Patent is hereby corrected as shown below:

Column 3, line 8, before "the" insert --embodying--;

Column 4, line 3, after "cell" insert --.--.

Signed and Sealed this

First Day of September, 1992

Attest:

DOUGLAS B. COMER

*Attesting Officer*   Acting Commissioner of Patents and Trademarks